(12) United States Patent
Huang et al.

(10) Patent No.: US 12,487,384 B2
(45) Date of Patent: Dec. 2, 2025

(54) METHOD FORMING GRATING DEVICE

(71) Applicant: VisEra Technologies Company Limited, Hsin-Chu (TW)

(72) Inventors: Chun-Wei Huang, Hsin-Chu (TW); Yu-Shan Tsai, Hsin-Chu (TW); Po-Han Fu, Hsin-Chu (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 339 days.

(21) Appl. No.: 17/955,800

(22) Filed: Sep. 29, 2022

(65) Prior Publication Data
US 2024/0111078 A1    Apr. 4, 2024

(51) Int. Cl.
G02B 5/18    (2006.01)
G03F 7/00    (2006.01)
G03F 7/16    (2006.01)

(52) U.S. Cl.
CPC .......... *G02B 5/1857* (2013.01); *G03F 7/001* (2013.01); *G03F 7/167* (2013.01)

(58) Field of Classification Search
CPC ............ G02B 5/00–32; G03F 7/001–167
See application file for complete search history.

(56) References Cited

U.S. PATENT DOCUMENTS

| 5,982,545 A | 11/1999 | Su |
| 10,983,257 B1 * | 4/2021 | Colburn .............. G02B 27/0172 |
| 2022/0026603 A1 * | 1/2022 | Ceballos ............... C23C 28/042 |

FOREIGN PATENT DOCUMENTS

| CN | 213814013 U | | 7/2021 |
| CN | 114959583 A | * | 8/2022 |
| JP | 10-335758 A | | 12/1998 |
| JP | 2003202405 A | | 7/2003 |
| JP | 2003255162 A | | 9/2003 |
| JP | 2004053720 A | | 2/2004 |
| JP | 2010501085 A | | 1/2010 |
| JP | 2021-113897 A | | 8/2021 |
| JP | 2023-166322 | | 11/2023 |
| KR | 102166765 B1 | * | 10/2020 |
| TW | 201605031 A | | 2/2016 |
| TW | 202135304 A | | 9/2021 |
| WO | WO2010018876 A1 | | 2/2010 |
| WO | WO2012/157719 | | 11/2012 |
| WO | WO2019087691 A1 | | 5/2019 |

OTHER PUBLICATIONS

The 2$^{nd}$ Office Action of its corresponding JP application No. 2023-034030 issued on Feb. 20, 2024 with its English translation.

* cited by examiner

*Primary Examiner* — Joshua L Allen
*Assistant Examiner* — Andrew Keelan Laobak
(74) *Attorney, Agent, or Firm* — MUNCY, GEISSLER, OLDS & LOWE, P.C.

(57) ABSTRACT

A method forming a grating device includes: providing a substrate; entering the substrate into a process chamber; and depositing a grating material on the substrate to form a grating material layer on the substrate. A refractive index of the grating material gradually changes during depositing the grating material in the process chamber. The grating material layer includes a varying refractive index.

19 Claims, 10 Drawing Sheets

METHOD FORMING GRATING DEVICE

BACKGROUND

Technical Field

The present disclosure is related to a method forming a grating device, and in particular it is related to forming a plurality of grating structures with varying refractive index.

Description of the Related Art

As light travels through a uniform material (such as air), it behaves as a series of plane waves traveling in the direction of propagation. When a plane wave meets an obstruction, it undergoes a change due to interaction with that obstruction. Every unobstructed point on the wavefront of the wave can be considered as a source of a secondary spherical wavelet with the same wavelength and phase as the incident wave. The outgoing wavefront is the combination of all of these wavelets. For example, if a plane wave that is traveling through water strikes a barrier that has a single small aperture (e.g., no wider than the wavelength), the incident plane wave may diffract outwardly from the aperture in a circular pattern. If the barrier contains an aperture that is larger than the wavelength, the wavefront emerges from the aperture.

A diffraction grating is a repetitive array of objects, either apertures or opaque constructions, which produce periodic changes to the phase and/or amplitude of an optical wave that emerges from the grating. One of the types is the one-dimensional (linear) Bragg diffraction grating. This diffraction grating resembles a comb, wherein there is a fixed, uniform spacing between the teeth. This uniform spacing, as well as the width and depth of the teeth, determines the output characteristics of the grating. The linear Bragg grating is designed to diffract light having a specific wavelength into modes that emerge along multiple discrete angles.

However, a conventional diffraction grating is wavelength-sensitive. In other words, the diffraction grating can only operate efficiently under a specific range of wavelength. To meet growing market demand, this and related issues need to be addressed.

SUMMARY

In an embodiment, a method forming a grating device includes: providing a substrate; entering the substrate into a process chamber; and depositing a grating material on the substrate to form a grating material layer on the substrate. A refractive index of the grating material gradually changes during depositing the grating material in the process chamber. The grating material layer includes a varying refractive index.

BRIEF DESCRIPTION OF THE DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

DETAILED DESCRIPTION

Figure 1:
FIGS. 1, 2A-2C, 3, and 4 are various cross-sectional views of intermediate stages in manufacturing a grating device, according to some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean±20% of the stated value, more typically ±10% of the stated value, more typically ±5% of the stated value, more typically ±3% of the stated value, more typically ±2% of the stated value, more typically ±1% of the stated value and even more typically ±0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the prior art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

In the fields of augmented reality (AR) and optical fibers, an optical component is required in order for optical signals changing traveling-direction (e.g. re-direct into a waveguide). A prism may be used, but the prism would be too large and heavy for portable devices. By replacing the prism with grating structures, optical signals may be more easily directed into the waveguide. In the AR system, the optical signals are transmitted through the waveguide, toward the grating structures which would adjust the light transmission to desired angle, and finally reaching the human eye.

In the same medium, an incident light ray may travel in a single direction without altering its course. When such an incident light ray enters another medium, it will refract based solely on the material characteristics of the new medium. This refraction cannot be controlled. A grating device may diffract the incident light ray in the desired direction. Besides possessing its own crystal momentum, the grating device may be designed to have the required structural characteristics (such as period, pitch, or duty cycle) for the incident light ray to achieve the desired diffraction. A conventional grating device includes grating structures made of a single material. The diffraction efficiency of the conventional single-material grating device can no longer satisfy consumer demand. Moreover, the waveband, which is the wavelength range where the grating device may operate efficiently, is very limiting. In other words, the diffraction efficiency of the conventional grating device is acceptable only under a certain wavelength. Therefore, the diffraction efficiency is very sensitive to waveband selection.

It has been discovered that designing the grating structures with a varying refractive index (or a refractive index gradient) can not only improve the diffraction efficiency, but can also enlarge the waveband where the diffraction efficiency is satisfactory for operation. In other words, the grating structures are less sensitive to waveband selection. According to some embodiments of the present disclosure, the process chamber for forming the grating material layer may be configured to allow the resulting grating material layer to possess the varying refractive index. As such, the manufacturing of the grating device can be achieved.

Figure 2A:
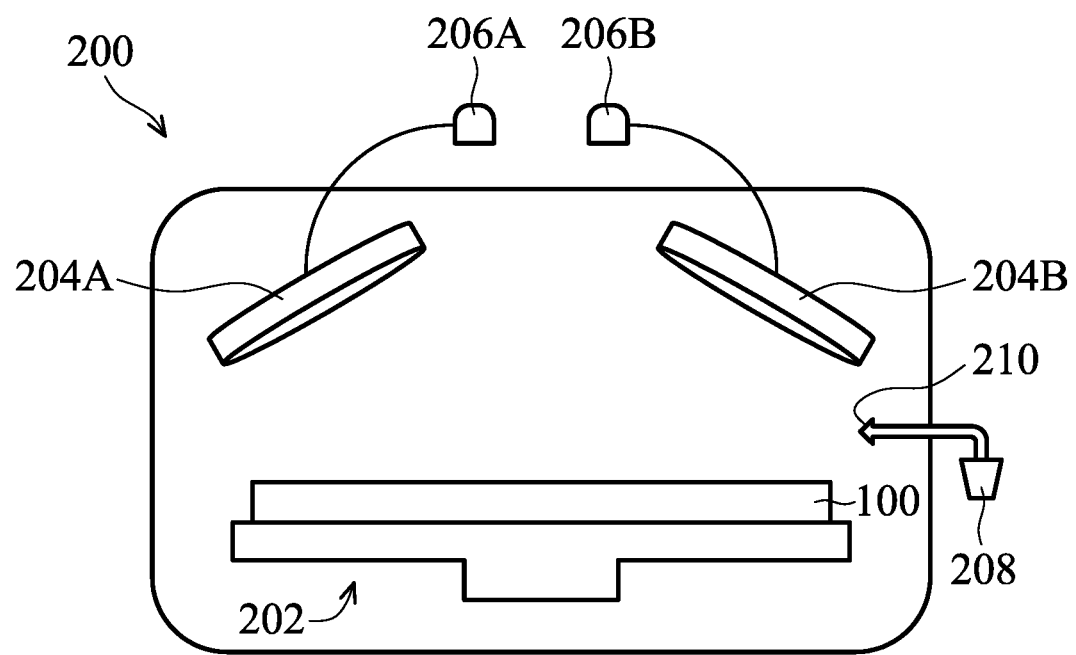
Figure 2B:
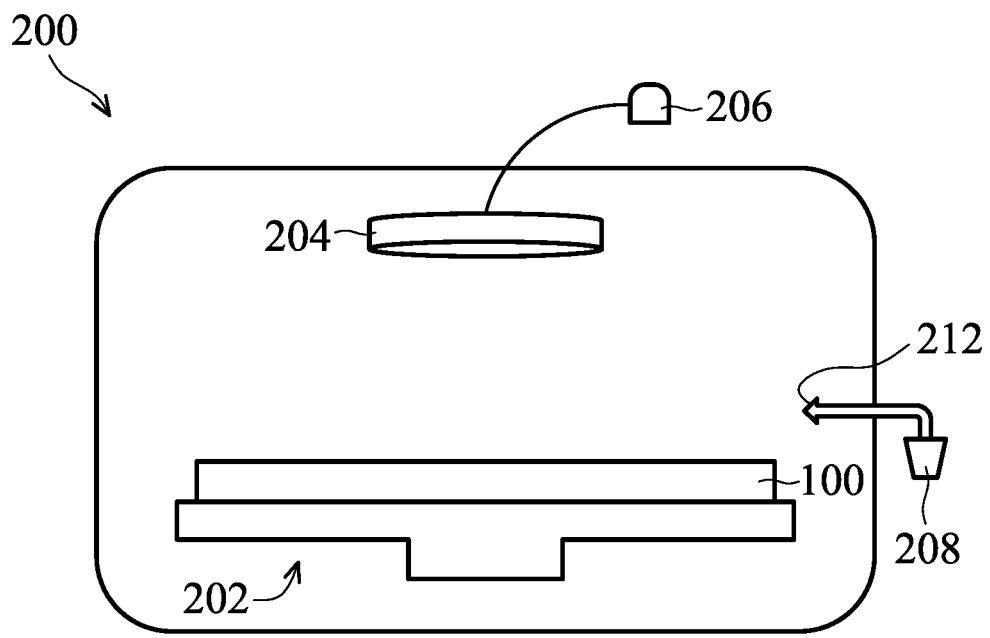
Figure 2C:
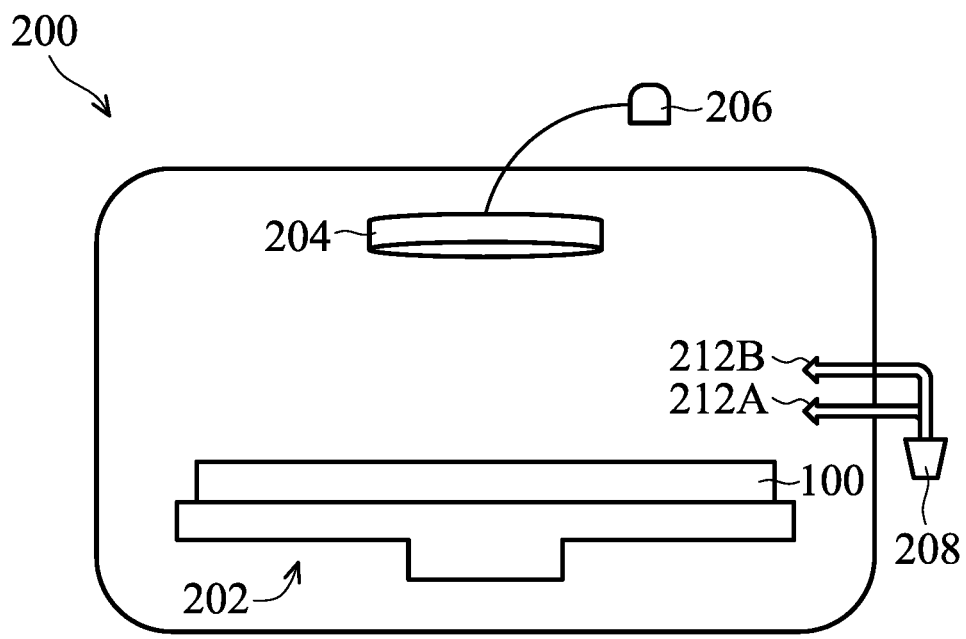
Figure 3:
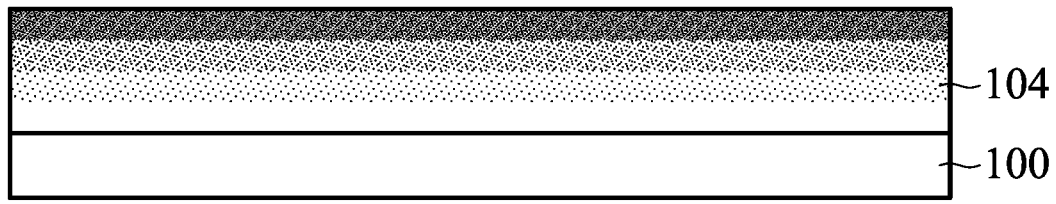

FIGS. 1, 2A-2C, 3, and 4 are various cross-sectional views of intermediate stages in manufacturing a grating device 10, according to some embodiments of the present disclosure. It is appreciated that FIGS. 2A-2C illustrate three different designs of a process chamber 200, respectively. Any of the designs in FIGS. 2A-2C may result in a grating material layer 104 formed on a substrate 100, as shown in FIG. 3. The configurations and operation methods of the illustrated process chambers 200 from FIGS. 2A-2C will be explained in detail later.

Referring to FIG. 1, the substrate 100 is provided. The substrate 100 may be, for example, a wafer or a chip, but the present disclosure is not limited thereto. In some embodiments, the substrate 100 may be a semiconductor substrate, for example, silicon substrate. Furthermore, in some embodiments, the semiconductor substrate may also be an elemental semiconductor including germanium, a compound semiconductor including gallium nitride (GaN), silicon carbide (SiC), gallium arsenide (GaAs), gallium phosphide (GaP), indium phosphide (InP), indium arsenide (InAs), and/or indium antimonide (InSb), an alloy semiconductor including silicon germanium (SiGe) alloy, gallium arsenide phosphide (GaAsP) alloy, aluminum indium arsenide (AlInAs) alloy, aluminum gallium arsenide (AlGaAs) alloy, gallium indium arsenide (GaInAs) alloy, gallium indium phosphide (GaInP) alloy, and/or gallium indium arsenide phosphide (GaInAsP) alloy, or a combination thereof. In some embodiments, the substrate 100 may be a photoelectric conversion substrate, such as a silicon substrate or an organic photoelectric conversion layer.

In other embodiments, the substrate 100 may also be a semiconductor on insulator (SOI) substrate. The semiconductor on insulator substrate may include a base plate, a buried oxide layer disposed on the base plate, and a semiconductor layer disposed on the buried oxide layer. Furthermore, the substrate 100 may be an N-type or a P-type conductive type.

As mentioned above, the substrate 100 may include isolation structures (not shown) to define active regions and to electrically isolate active region elements within or above the substrate 100, but the present disclosure is not limited thereto. The isolation structures may include deep trench isolation (DTI) structures, shallow trench isolation (STI) structures, or local oxidation of silicon (LOCOS) structures. In some embodiments, the formation of the isolation structures may include, for example, forming an insulating layer on the substrate 100, selectively etching the insulating layer and the substrate 100 to form trenches that extend from the top surface of the substrate 100 to a position within the substrate 100, in which the trenches are located between adjacent active regions. Next, the formation of the isolation structures may include growing rich nitrogen-containing (such as silicon oxynitride) liners along the trenches, followed by filling insulating materials (such as silicon dioxide, silicon nitride, or silicon oxynitride) into the trenches with deposition processes. After that, an annealing process is performed on the insulating materials in the trenches, followed by a planarization process on the substrate 100 to remove excessive insulating materials, so the insulating materials in the trenches are level with the top surface of the substrate 100.

In some embodiments, the substrate 100 may include various P-type doped regions and/or N-type doped regions (not shown) formed by, for example, an ion implantation and/or diffusion process. In some embodiments, transistors, photodiodes, or the like, may be formed at the active regions, defined by the isolation structures.

FIGS. 2A-2C illustrate three distinct designs of the process chambers 200 where the grating material layer 104 with the varying refractive index may be formed. It should be noted that the designs of FIGS. 2A-2C are independent of each other. Any of the three designs may be selected and utilized alone to form the grating material layer 104 on the substrate 100. In some embodiments, the process chamber 200 may be a system used in a physical vapor deposition (PVD) process. The physical vapor deposition (PVD) process may include evaporating, sputtering, plating, the like, or combinations thereof. According to a specific embodiment of the present disclosure, the process chamber 200 applies the sputtering technique.

Referring to FIG. 2A, the substrate 100 is entered into the process chamber 200. In FIG. 2A, the process chamber 200 may include a carrier 202, a first target 204A, a second target 204B, a first voltage controller 206A, a second voltage controller 206B, an air valve 208, and a process gas 210. In some embodiments, the substrate 100 is held and secured by the carrier 202 in a fixed position. The first target 204A and the second target 204B are placed above the substrate 100, wherein the top surface of the substrate 100 faces the first target 204A and the second target 204B. In the present embodiment, the first target 204A and the second target 204B are connected to the first voltage controller 206A and the second voltage controller 206B, respectively. The process gas 210 is injected by the air valve 208 into the chamber 200. In a specific embodiment of the present disclosure, the process chamber 200 of FIG. 2A is a co-sputtering configuration. In other embodiments, one or more additional targets may be configured within the process chamber 200, along with the first target 204A and the second target 204B.

Still referring to FIG. 2A, the first target 204A and the second target 204B may deposit a first material and a second material, respectively. In some embodiments, the refractive index of the first material and the refractive index of the second material are different. According to a specific embodiment of the present disclosure, the refractive index of the first material may be close to or equal to that of the substrate 100, and the second material has a higher refractive index than the first material. The first voltage controller 206A and the second voltage controller 206B may each supply a voltage to the first target 204A and the second target 204B, respectively. The voltage supplied may determine the flow rate of the first material or the second material being deposited. By adjusting the first voltage controller 206A or the second voltage controller 206B, the users may control the flow rate of the first material or the flow rate of the second material, respectively.

Referring to FIG. 2A, the grating material is deposited in the process chamber 200 to form the grating material layer 104 on the substrate 100. Since the grating material layer 104 has a varying refractive index, the duration of the grating material deposition in the process chamber 200 may be divided into a first stage (or an initial stage), a second stage (or a middle stage), and a third stage (or a concluding stage), for ease of explanation. During the first stage, the first voltage controller 206A supplies a voltage at a set value, and the second voltage controller 206B supplies a voltage at 0 (no voltage). In some embodiments, the voltage at a set value may be approximately between 400V and 800V. During the second stage, the voltage supplied by the first voltage controller 206A gradually decreases, while the voltage supplied by the second voltage controller 206B gradually increases. During the third stage, the voltage supplied by the first voltage controller 206A reaches 0, while the voltage supplied by the second voltage controller 206B reaches the set value.

Based on the varying supplied voltage described above, the flow rates of the first material and the second material may also varied accordingly. During the first stage, the first material is deposited from the first target 204A with a flow rate at a set value, and the second material is deposited from the second target 204B at a flow rate of 0. In some embodiments, the flow rate at a set value may be approximately between 50 sccm and 250 sccm. During the second stage, the flow rate of the first material gradually decreases, while the flow rate of the second material gradually increases. During the third stage, the flow rate of the first material reaches 0, while the flow rate of the second material reaches the set value. In the present embodiment, the flow rate of the process gas 210 injected into the process chamber 200 remains the same throughout the first stage, the second stage, and the third stage. The process gas 210 may include one or more elements that react with the first material and/or the second material inside the process chamber 200. Since the flow rate of the process gas 210 is stable during the grating material deposition, the varying refractive index of the grating material layer 104 is not affected by the process gas 210.

Referring to FIG. 2B, the substrate 100 is entered into the process chamber 200. In FIG. 2B, the process chamber 200 may include the carrier 202, a target 204, a voltage controller 206, the air valve 208, and a process gas 212. In some embodiments, the substrate 100 is held and secured by the carrier 202 in a fixed position. The target 204 is placed above the substrate 100, wherein the top surface of the substrate 100 faces the target 204. In the present embodiment, the target 204 is connected to the voltage controller 206. The process gas 212 is injected by the air valve 208 into the chamber 200. In comparison with the process gas 210 of stable flow rate in FIG. 2A, the process gas 212 has a varying flow rate.

Still referring to FIG. 2B, the target 204 may deposit a material. According to a specific embodiment of the present disclosure, the refractive index of the material may be close to or equal to that of the substrate 100. The voltage controller 206 may supply a voltage to the target 204. The voltage supplied may determine the flow rate of the material being deposited. By adjusting the voltage controller 206, the users may control the flow rate of the material. In the present embodiment, the voltage controller 206 may supply a constant voltage at a set value. In some embodiments, the set value of the constant voltage may be approximately between 400V and 800V. Based on the constant voltage described above, the material may also be deposited at a constant flow rate with a set value. In some embodiments, the constant flow rate of the material at a set value may be approximately between 50 sccm and 250 sccm.

In the present embodiment, the flow rate of the process gas 212 injected into the process chamber 200 may vary during the grating material deposition. During the first stage, the process gas 212 is injected into the process chamber 200 at a flow rate of 0. During the second stage, the flow rate of the process gas 212 gradually increases. During the third stage, the flow rate of the process gas 212 reaches a set value. In some embodiments, the flow rate of the process gas 212 at a set value may be approximately between 50 sccm and 250 sccm. The process gas 212 may react with the material inside the process chamber 200 before being deposited onto the substrate 100. Since the flow rate of the process gas 212 varies during the grating material deposition, the amount of the deposited material being reacted with the process gas 212 may also vary throughout the first stage, the second stage, and the third stage. As a result, the grating material layer 104 including the varying refractive index may be realized.

Referring to FIG. 2C, the substrate 100 is entered into the process chamber 200. In FIG. 2C, the process chamber 200 may include the carrier 202, the target 204, the voltage controller 206, the air valve 208, a first process gas 212A, and a second process gas 212B. In some embodiments, the substrate 100 is held and secured by the carrier 202 in a fixed position. The target 204 is placed above the substrate 100, wherein the top surface of the substrate 100 faces the target 204. In the present embodiment, the target 204 is connected to the voltage controller 206. The first process gas 212A and the second process gas 212B are injected by the air valve 208 into the process chamber 200. Similar with the process gas 212 of varying flow rate in FIG. 2B, the first process gas 212A and the second process gas 212B also have varying flow rates. However, the flow rate of the first process gas 212A and the flow rate of the second process gas 212B may vary differently. In other embodiments, one or more additional process gases may be injected into the process chamber 200, along with the first process gas 212A and the second process gas 212B.

The operating features of the target 204 and the voltage controller 206 may be similar to those of FIG. 2B, and the details are not described again herein to avoid repetition. During the first stage, the first process gas 212A is injected into the process chamber 200 with a flow rate at a set value, and the second process gas 212B is injected into the process chamber 200 at a flow rate of 0. In some embodiments, the flow rate at a set value may be approximately between 50 sccm and 250 sccm. During the second stage, the flow rate of the first process gas 212A gradually decreases, while the flow rate of the second process gas 212B gradually increases. During the third stage, the flow rate of the first process gas 212A reaches 0, while the flow rate of the second process gas 212B reaches the set value. The first process gas 212A and the second process gas 212B may react with the deposited material inside the process chamber 200. According to a specific embodiment of the present disclosure, the refractive index of the material reacted with the first process gas 212A may be close to or equal to that of the substrate 100, and the material reacted with the second process gas 212B has a higher refractive index than the material reacted with the first process gas 212A.

Referring to FIG. 3, the grating material layer 104 with the varying refractive index may be formed on the substrate 100. Through the process chamber 200 illustrated in anyone of FIGS. 2A-2C, the varying refractive index of the grating material layer 104 may be achieved. The thickness of the grating material layer 104 may be approximately between 10 nm and 1 μm. The portion of the grating material layer 104 close to the substrate 100 may have a refractive index close to or equal to that of the substrate 100. According to some embodiments of the present disclosure, the refractive index of the grating material layer 104 gradually increases in a vertical direction away from the substrate 100. The refractive index of the grating material layer 104 may vary approximately between 1.4 and 4.0.

Figure 4:
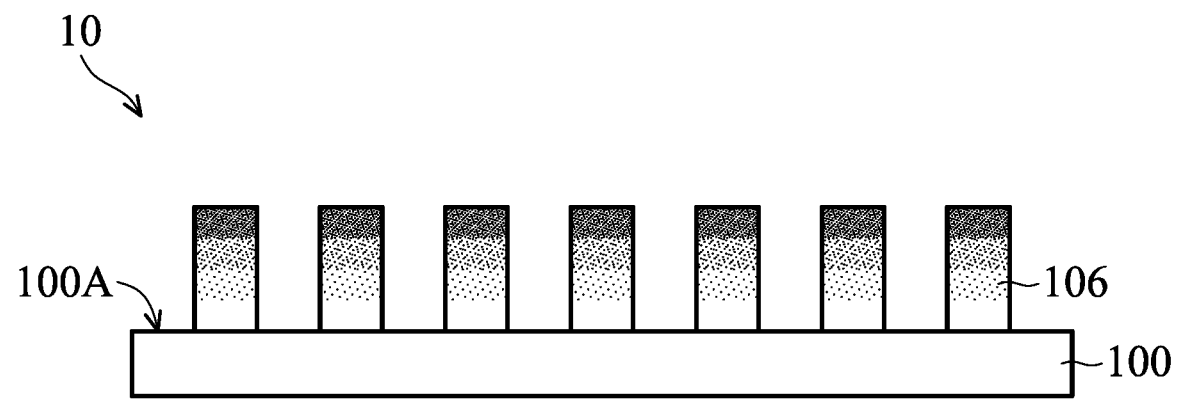

Referring to FIG. 4, the grating material layer 104 may be patterned to form a plurality of grating structures 106. More specifically, a hard mask layer (not shown) may be initially formed on the grating material layer 104. Next a photolithography patterning and etching may be performed on the hard mask layer to form a hard mask pattern. After that, the shape of the hard mask pattern may be transferred to the grating material layer 104 through a dry etching process to obtain the plurality of grating structures 106 with the varying refractive index.

Upon forming the plurality of grating structures 106, the fabrication of the grating device 10 is completed. The height of each of the plurality of grating structures 106 may be equivalent to the thickness of the grating material layer 104. The width of each of the plurality of grating structures 106 may be approximately between 50 nm and 1000 nm. The width and the pitch together may constitute a period of the plurality of grating structures 106. The duty cycle of the plurality of grating structures 106 may be approximately between 10% and 90%. A duty cycle may be regarded as the filling factor (or the "density") of the plurality of grating structures 106, which is calculated by the total area of the plurality of grating structures 106 divided by the area of the given region when viewed from top. According to some embodiments of the present disclosure, the refractive index of the plurality of grating structures 106 gradually increases in a vertical direction perpendicular to a top surface 100A of the substrate 100.

Figure 5A:
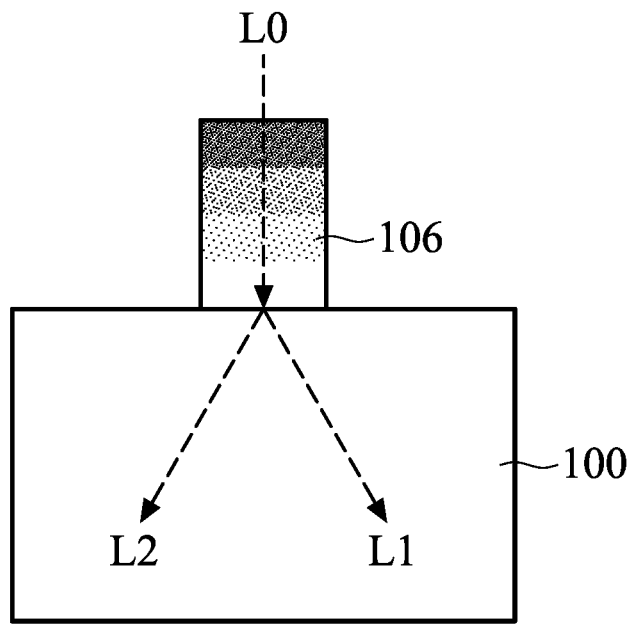
FIGS. 5A and 5B illustrate a diffraction efficiency of the grating device, according to some embodiments of the present disclosure.
Figure 5B:
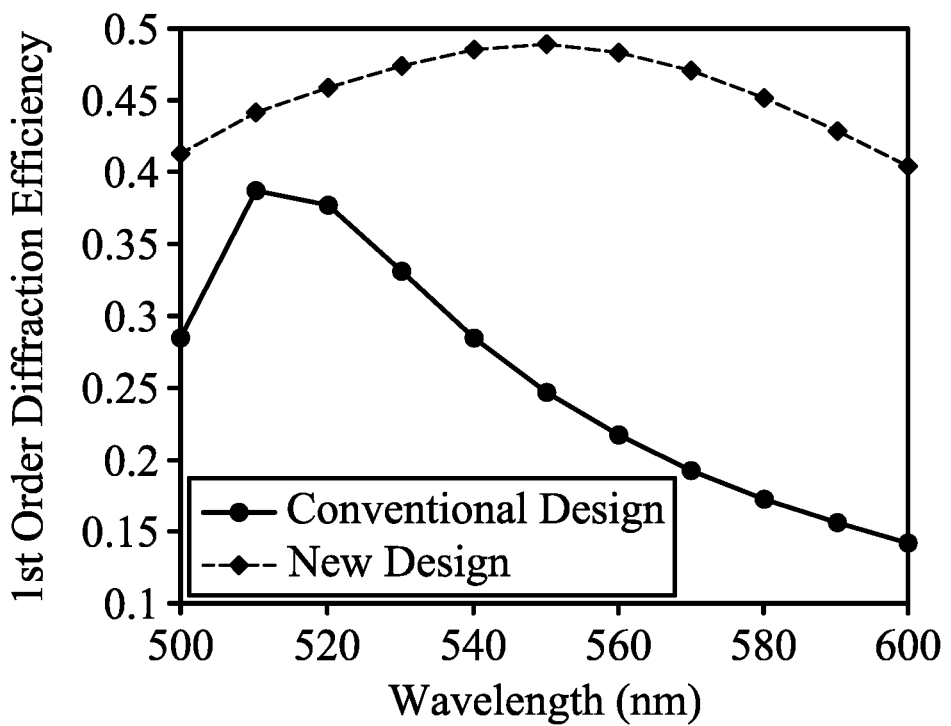

FIGS. 5A and 5B illustrate a diffraction efficiency of the grating device 10, according to some embodiments of the present disclosure. Referring to FIG. 5A, a section of the grating device 10 is illustrated, along with a schematic diagram showing how a light ray may diffract. In some embodiments, when an incident light ray L0 is transmitted in a direction that is normal to the grating device 10, the light ray L0 may be diffracted into a positive diffraction light ray L1 and a negative diffraction light ray L2. Since the incident light ray L0 is transmitted in a direction that is normal to the plurality of grating structures 106, the positive diffraction light ray L1 and the negative diffraction light ray L2 are symmetrical with each other. In the present embodiment, the positive diffraction light ray L1 and the negative diffraction light ray L2 may be a $1^{st}$ order diffraction.

Referring to FIG. 5B, a comparison of the diffraction efficiency between a conventional grating device (without the varying refractive index) and the grating device (with the varying refractive index) is illustrated in a plot. Since the positive diffraction light ray L1 and the negative diffraction light ray L2 are symmetrical, they have the same diffraction efficiency. The plot shown in FIG. 5B illustrates the diffraction efficiency of the positive diffraction light ray L1 or the negative diffraction light ray L2, with respect to wavelength. In an ideal situation, the incident light ray L0 may be completely diffracted and equally divided into the positive diffraction light ray L1 and the negative diffraction light ray L2. Therefore, the positive diffraction light ray L1 or the negative diffraction light ray L2 should ideally possess 50% of diffraction efficiency. The diffraction efficiency determines how bright a resulting image may appear in the human eye.

As shown in the plot of FIG. 5B, the conventional grating device has a peak diffraction efficiency slightly under 40%, and the diffraction efficiency is above 35% only under the wavelength approximately between 505 nm and 525 nm. With the varying refractive index, the grating device 10 has a peak diffraction efficiency close to 50%, and the diffraction efficiency is above 40% throughout the wavelength from 500 nm to 600 nm, with the mean value of approximately 45%. Not only has applying the varying refractive index improved the diffraction efficiency, the grating device 10 is able to maintain a higher level of diffraction efficiency for a much broader range of wavelength comparing with the conventional grating device. The grating device 10 may operate efficiently in a larger waveband. As shown in the plot, the diffraction efficiency of the conventional grating device begins to drop significantly from the wavelength of 540 nm and up. In other words, the grating device 10 appears to be much less sensitive to the waveband selection. In summary, the grating device 10 with the varying refractive index may improve diffraction efficiency and enlarge waveband for light rays to be diffracted.

Figure 6:
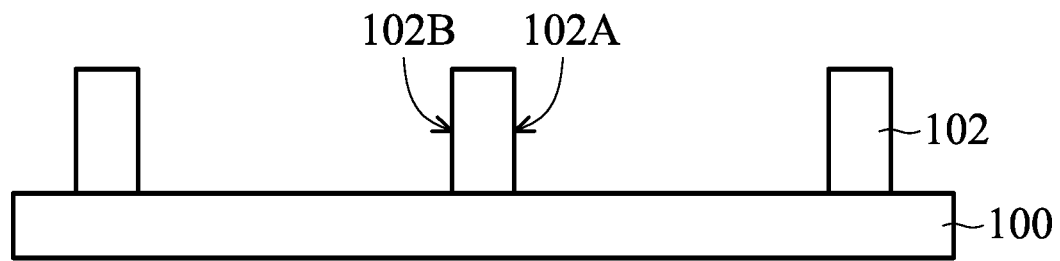
FIGS. 6, 7A, 7B, 8, and 9 are various cross-sectional views of intermediate stages in manufacturing a grating device, according to other embodiments of the present disclosure.
Figure 7A:
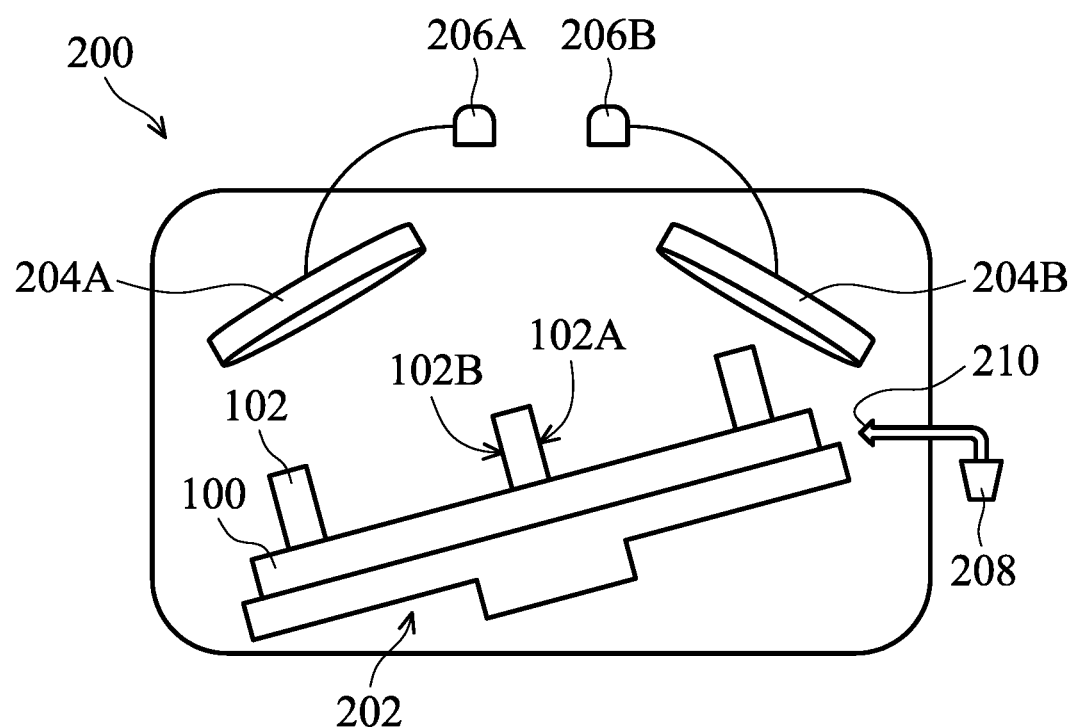
Figure 7B:
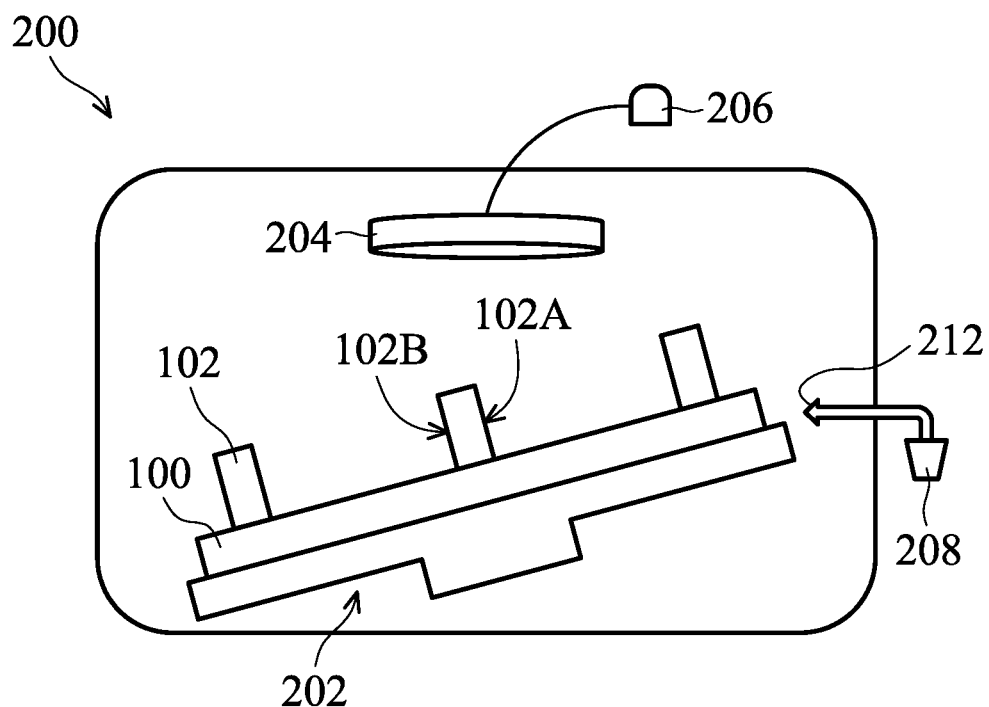
Figure 8:
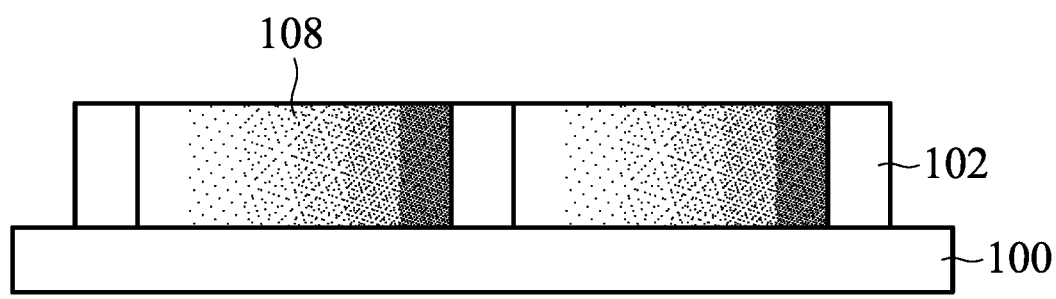

FIGS. 6, 7A, 7B, 8, and 9 are various cross-sectional views of intermediate stages in manufacturing a grating device 20, according to other embodiments of the present disclosure. It is appreciated that FIGS. 7A and 7B illustrate two different designs of process chambers 200, respectively. Either of the designs in FIGS. 7A and 7B may result in a grating material layer 108 formed on the substrate 100, as shown in FIG. 8. The configurations and operation methods of the illustrated process chambers 200 from FIGS. 7A and 7B may be similar to the process chambers 200 from FIGS. 2A and 2B, respectively.

Referring to FIG. 6, the substrate 100 is provided. The substrate 100 of FIG. 6 is similar to that shown in FIG. 1, and the details are not described again herein to avoid repetition. Before the substrate 100 is entered into the process chambers 200 of FIG. 7A or 7B, a plurality of pre-process grating structures 102 may be formed on the substrate 100. In some embodiments, the plurality of pre-process grating structures 102 include a first sidewall 102A and a second sidewall 102B that is opposite the first sidewall 102A. The pitch of the plurality of pre-process grating structures 102 (or the spacing between neighboring pre-process grating structures 102) may be approximately between 0.2 and 1.5 times the wavelength to which the device is to be operated under. The duty cycle of each of the plurality of pre-process grating structures 102 may be approximately between 20% and 80%. The height of each of the plurality of pre-process grating structures 102 may be approximately between 1 and 30 times the width thereof. The refractive index of the plurality of pre-process grating structures 102 may be close to or equal to that of the substrate 100.

Referring to FIG. 7A, the substrate 100, with the plurality of pre-process grating structures 102 disposed thereon, is entered into the process chamber 200. In comparison with the process chamber 200 shown in FIG. 2A, the carrier 202 is tilted to one side, so the first sidewall 102A or the second sidewall 102B (the first sidewall 102A in the present embodiment) is disposed facing the overlying first target 204A and second target 204B. The operating features of the carrier 202, the first target 204A, the second target 204B, the first voltage controller 206A, the second voltage controller 206B, the air valve 208, and the process gas 210 may be similar to those of FIG. 2A, and the details are not described again herein to avoid repetition.

Still referring to FIG. 7A, due to the tilted disposition of the substrate 100 and the structural feature of the plurality of pre-process grating structures 102, the grating material deposition may grow on the first sidewall 102A along the top surface of the substrate 100. During the first stage, the first material is deposited from the first target 204A with a flow rate at a set value, and the second material is deposited from the second target 204B at a flow rate of 0. During the second stage, the flow rate of the first material gradually decreases, while the flow rate of the second material gradually increases. During the third stage, the flow rate of the first material reaches 0, while the flow rate of the second material reaches the set value. According to some embodiments of the present disclosure, the grating material may fill the spacing between neighboring pre-process grating structures 102.

Referring to FIG. 7B, the substrate 100, with the plurality of pre-process grating structures 102 disposed thereon, is entered into the process chamber 200. In comparison with the process chamber 200 shown in FIG. 2B, the carrier 202 is tilted to one side, so the first sidewall 102A or the second sidewall 102B (the first sidewall 102A in the present embodiment) is disposed facing the overlying target 204. The operating features of the carrier 202, the target 204, the voltage controller 206, the air valve 208, and the process gas 212 may be similar to those of FIG. 2B, and the details are not described again herein to avoid repetition.

Still referring to FIG. 7B, due to the tilted disposition of the substrate 100 and the structural feature of the plurality of pre-process grating structures 102, the grating material deposition may grow on the first sidewall 102A along the top surface of the substrate 100. During the first stage, the process gas 212 is injected into the process chamber 200 at a flow rate of 0. During the second stage, the flow rate of the process gas 212 gradually increases. During the third stage, the flow rate of the process gas 212 reaches a set value.

According to some embodiments of the present disclosure, the grating material deposition may fill the spacing between neighboring pre-process grating structures 102. In other embodiments, one or more additional process gases may be injected into the process chamber 200, along with the process gas 212 (for example, refer to FIG. 2C), and the details are omitted herein for simplicity.

Referring to FIG. 8, the grating material layer 108 with the varying refractive index may be formed on the substrate 100. Through the process chamber 200 illustrated in either of FIGS. 7A and 7B, the varying refractive index of the grating material layer 108 may be achieved. Dimensions of the grating material layer 108 may be similar to those of the grating material layer 104 from FIG. 3, and the details are not described again herein to avoid repetition. The portion of the grating material layer 108 close to the first sidewall 102A may have a refractive index close to or equal to that of the plurality of pre-process grating structures 102 (or the substrate 100). In comparison with the grating material layer 104 of FIG. 3, the refractive index of the grating material layer 108 gradually increases in a horizontal direction away from the first sidewall 102A. The refractive index of the grating material layer 108 may vary approximately between 1.4 and 4.0.

Figure 9:
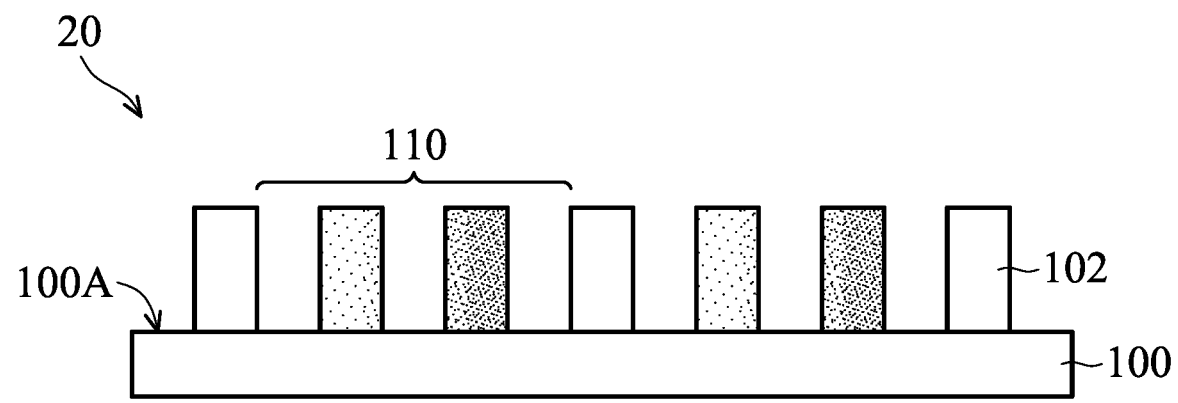

Referring to FIG. 9, the grating material layer 108 may be patterned to form a plurality of grating structures 110. The formation of the plurality of grating structures 110 may be similar to that of the plurality of grating structures 106 in FIG. 4, and the details are not described again herein to avoid repetition. Upon forming the plurality of grating structures 110, the fabrication of the grating device 20 is completed. The height and the width of each of the plurality of grating structures 110 may be equivalent to those of each of the plurality of pre-process grating structures 102.

The pitch of the plurality of grating structures 110 and the plurality of pre-process grating structures 102 together may be approximately between 0.2 and 1.5 times the wavelength to which the device is to be operated under. The duty cycle of the plurality of grating structures 110 and the plurality of pre-process grating structures 102 together may be approximately between 20% and 80%. According to some embodiments of the present disclosure, the refractive index of each of the plurality of grating structures 110 gradually increases in a horizontal direction parallel to the top surface 100A of the substrate 100. Moreover, within each spacing between neighboring pre-process grating structures 102, the plurality of grating structures 110 are arranged in an array, in which the array as a whole also has gradually increasing refractive index in a horizontal direction parallel to the top surface 100A of the substrate 100. Since the same array is arranged repeatedly in every spacing between neighboring pre-process grating structures 102, the period of the grating device 20 is constituted by one of the plurality of pre-process grating structures 102 and the adjacent spacing that includes the array of the plurality of grating structures 110.

Figure 10:
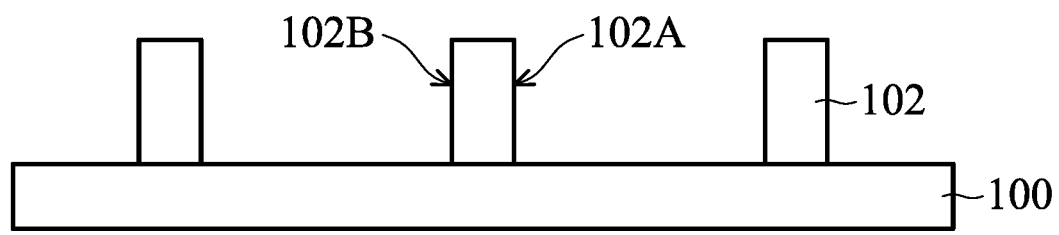
FIGS. 10, 11A, 11B, 12, 13A, 13B, and 14 are various cross-sectional views of intermediate stages in manufacturing a grating device, according to yet other embodiments of the present disclosure.
Figure 11A:
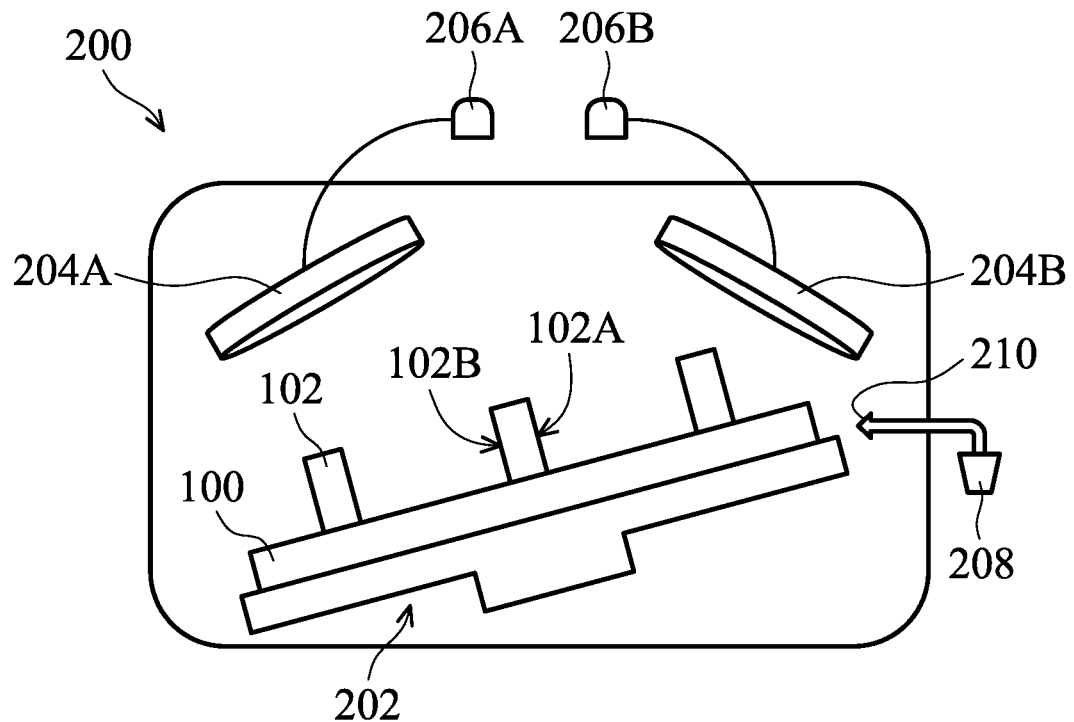
Figure 11B:
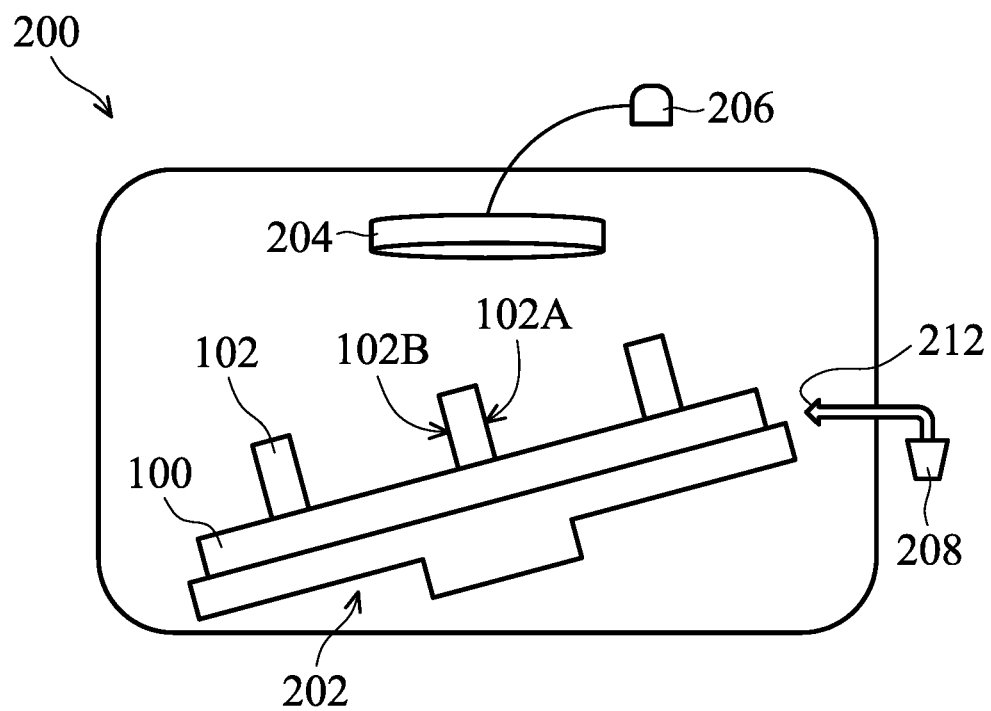
Figure 12:
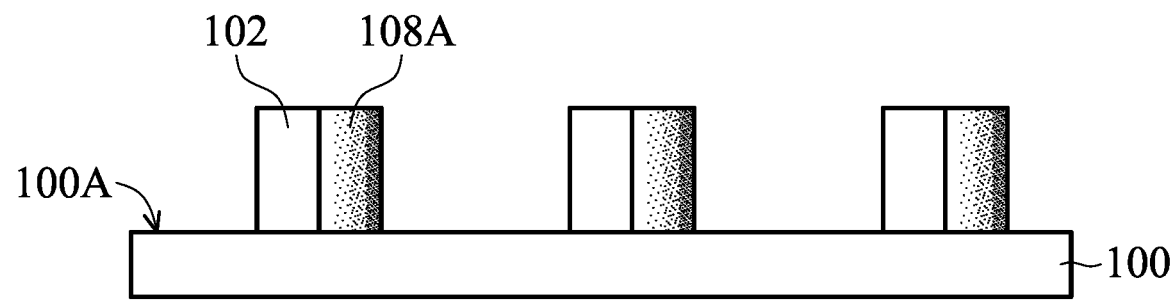
Figure 13A:
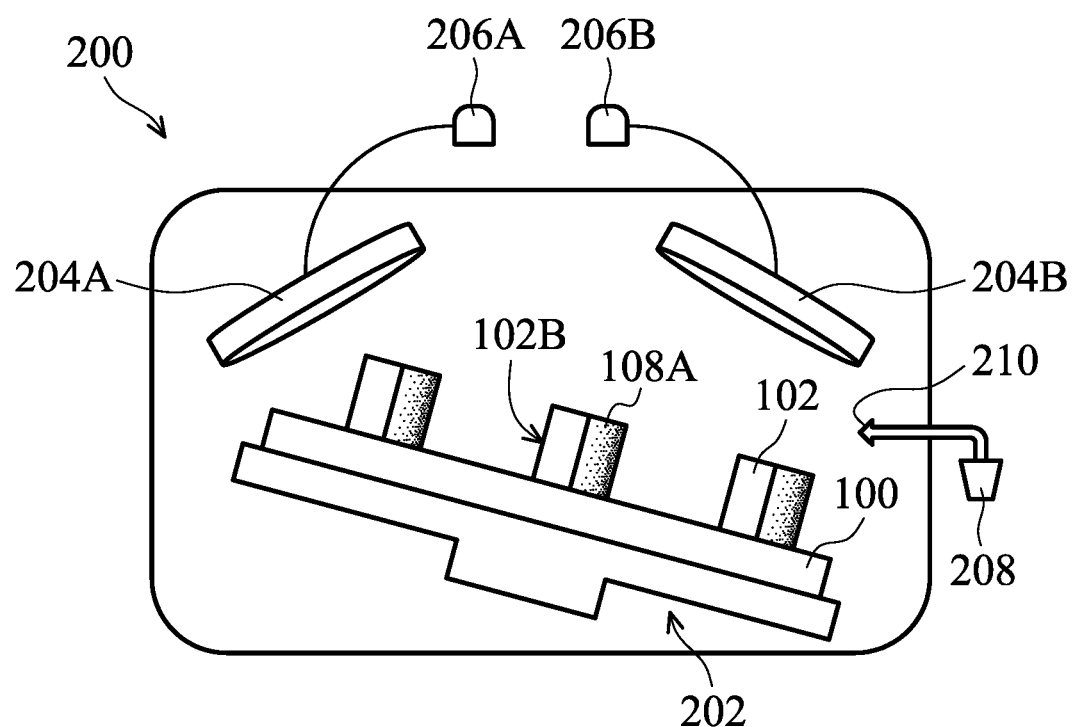
Figure 13B:
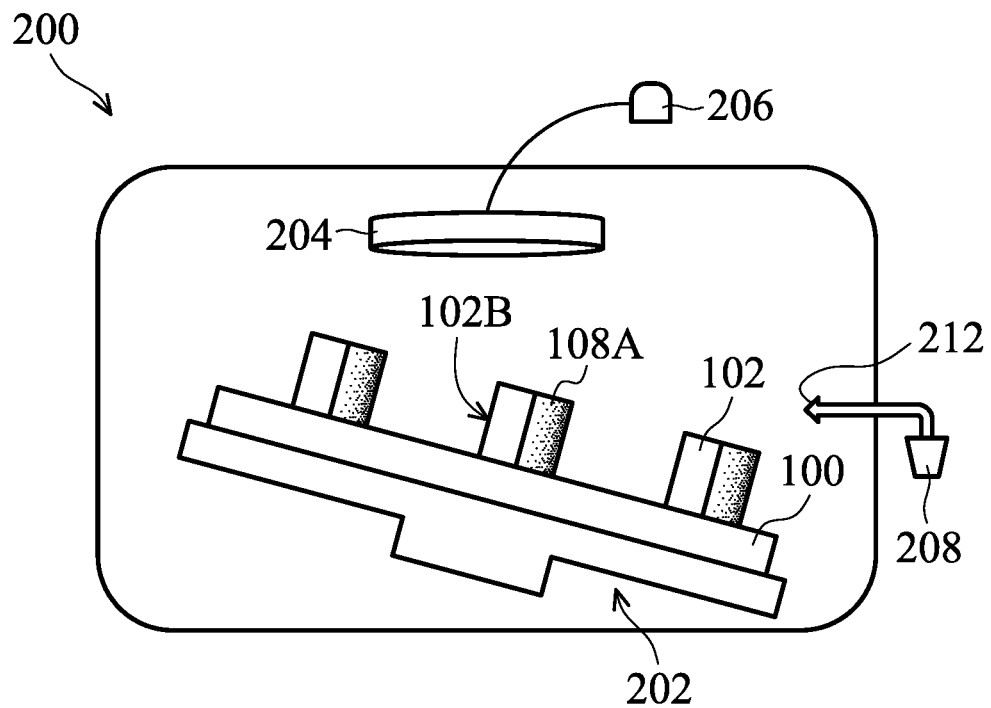
Figure 14:
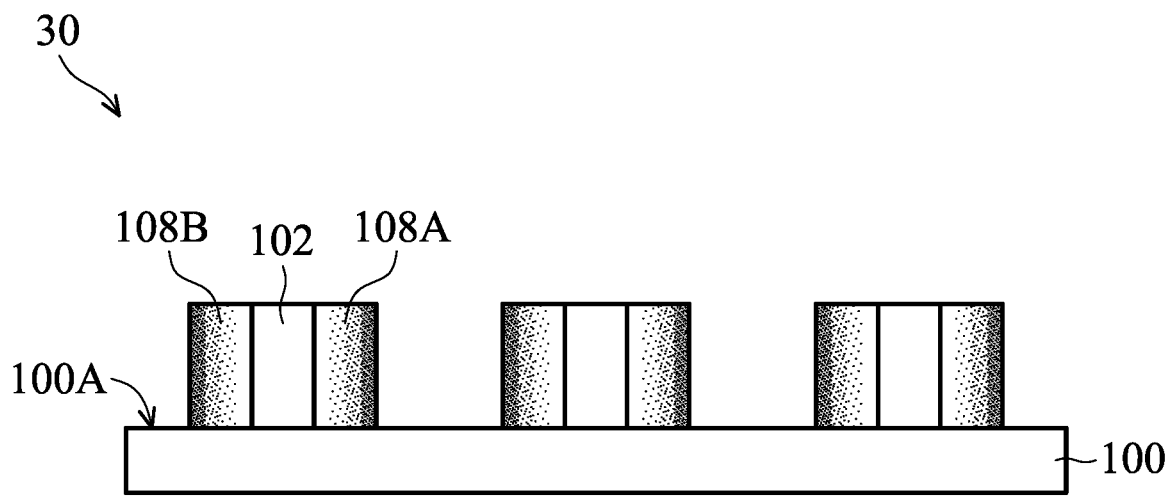

FIGS. 10, 11A, 11B, 12, 13A, 13B, and 14 are various cross-sectional views of intermediate stages in manufacturing a grating device 30, according to yet other embodiments of the present disclosure. It is appreciated that FIGS. 11A and 11B illustrate two different designs of the process chambers 200, respectively. Either of the designs in FIGS. 11A and 11B may result in a first grating material layer 108A formed on the substrate 100, as shown in FIG. 12. The configurations and operation methods of the illustrated process chambers 200 from FIGS. 11A and 11B may be similar to the process chambers 200 from FIGS. 7A and 7B. Similarly, FIGS. 13A and 13B illustrate two different designs of the process chambers 200, respectively. Either of the designs in FIGS. 13A and 13B may result in a second grating material layer 108B formed on the substrate 100, as shown in FIG. 14. The configurations and operation methods of the illustrated process chambers 200 from FIGS. 13A and 13B may be similar to the process chambers 200 from FIGS. 11A and 11B. In comparison with the previous embodiments, two process cycles, instead of only one process cycle, of the grating material deposition are performed to obtain the structure shown in FIG. 14.

Referring to FIG. 10, the substrate 100 is provided. The substrate 100 and the plurality of pre-process grating structures 102 disposed thereon in FIG. 10 are similar to those shown in FIG. 6, and the details are not described again herein to avoid repetition.

Referring to FIG. 11A, the substrate 100, with the plurality of pre-process grating structures 102 disposed thereon, is entered into the process chamber 200. The operating method of FIG. 11A is substantially identical to that described in FIG. 7A, and the details are not described again herein to avoid repetition. The operating features of the carrier 202, the first target 204A, the second target 204B, the first voltage controller 206A, the second voltage controller 206B, the air valve 208, and the process gas 210 may be similar to those of FIG. 7A, and the details are not described again herein to avoid repetition.

Still referring to FIG. 11A, due to the tilted disposition of the substrate 100 and the structural feature of the plurality of pre-process grating structures 102, the grating material deposition may grow on the first sidewall 102A along the top surface of the substrate 100. During the first stage, the first material is deposited from the first target 204A with a flow rate at a set value, and the second material is deposited from the second target 204B at a flow rate of 0. During the second stage, the flow rate of the first material gradually decreases, while the flow rate of the second material gradually increases. During the third stage, the flow rate of the first material reaches 0, while the flow rate of the second material reaches the set value. In comparison with the procedure of FIG. 7A, the grating material deposition may only partially fill the spacing between neighboring pre-process grating structures 102.

Referring to FIG. 11B, the substrate 100, with the plurality of pre-process grating structures 102 disposed thereon, is entered into the process chamber 200. The operating method of FIG. 11B is substantially identical to that described in FIG. 7B, and the details are not described again herein to avoid repetition. The operating features of the carrier 202, the target 204, the voltage controller 206, the air valve 208, and the process gas 212 may be similar to those of FIG. 7B, and the details are not described again herein to avoid repetition.

Still referring to FIG. 11B, due to the tilted disposition of the substrate 100 and the structural feature of the plurality of pre-process grating structures 102, the grating material deposition may grow on the first sidewall 102A along the top surface of the substrate 100. During the first stage, the process gas 212 is injected into the process chamber 200 at a flow rate of 0. During the second stage, the flow rate of the process gas 212 gradually increases. During the third stage, the flow rate of the process gas 212 reaches a set value. In comparison with the procedure of FIG. 7B, the grating material deposition may only partially fill the spacing between neighboring pre-process grating structures 102. In other embodiments, one or more additional process gases may be injected into the process chamber 200, along with the process gas 212 (for example, refer to FIG. 2C), and the details are omitted herein for simplicity.

Referring to FIG. 12, the first grating material layer 108A with the varying refractive index may be formed on the substrate 100. Through the process chamber 200 illustrated in either of FIGS. 11A and 11B, the varying refractive index of the first grating material layer 108A may be achieved. Dimensions of the first grating material layer 108A may be similar to those of the plurality of pre-process grating structures 102, and the details are not described again herein to avoid repetition. The portion of the first grating material layer 108A close to the first sidewall 102A may have a refractive index close to or equal to that of the plurality of pre-process grating structures 102 (or the substrate 100). According to some embodiments of the present disclosure, the refractive index of the first grating material layer 108A gradually increases in a horizontal direction away from the first sidewall 102A. The refractive index of the first grating material layer 108A may vary approximately between 1.4 and 4.0.

Referring to FIG. 13A, the substrate 100, with the plurality of pre-process grating structures 102 and the first grating material layer 108A disposed thereon, is entered into the process chamber 200. In comparison with the process chamber 200 shown in FIG. 11A, the carrier 202 is tilted to another side, so the second sidewall 102B is disposed facing the overlying first target 204A and second target 204B. The operating features of the carrier 202, the first target 204A, the second target 204B, the first voltage controller 206A, the second voltage controller 206B, the air valve 208, and the process gas 210 may be similar to those of FIG. 11A, and the details are not described again herein to avoid repetition.

Still referring to FIG. 13A, due to the tilted disposition of the substrate 100 and the structural feature of the plurality of pre-process grating structures 102, the grating material deposition may grow on the second sidewall 102B along the top surface of the substrate 100. During the first stage, the first material is deposited from the first target 204A with a flow rate at a set value, and the second material is deposited from the second target 204B at a flow rate of 0. During the second stage, the flow rate of the first material gradually decreases, while the flow rate of the second material gradually increases. During the third stage, the flow rate of the first material reaches 0, while the flow rate of the second material reaches the set value. Similar with the procedure of FIG. 11A, the grating material deposition may only partially fill the spacing between neighboring pre-process grating structures 102.

Referring to FIG. 13B, the substrate 100, with the plurality of pre-process grating structures 102 and the first grating material layer 108A disposed thereon, is entered into the process chamber 200. In comparison with the process chamber 200 shown in FIG. 11B, the carrier 202 is tilted to another side, so the second sidewall 102B is disposed facing the overlying target 204. The operating features of the carrier 202, the target 204, the voltage controller 206, the air valve 208, and the process gas 212 may be similar to those of FIG. 11B, and the details are not described again herein to avoid repetition.

Still referring to FIG. 13B, due to the tilted disposition of the substrate 100 and the structural feature of the plurality of pre-process grating structures 102, the grating material deposition may grow on the second sidewall 102B along the top surface of the substrate 100. During the first stage, the process gas 212 is injected into the process chamber 200 at a flow rate of 0. During the second stage, the flow rate of the process gas 212 gradually increases. During the third stage, the flow rate of the process gas 212 reaches a set value. Similar with the procedure of FIG. 11B, the grating material deposition may only partially fill the spacing between neighboring pre-process grating structures 102. In other embodiments, one or more additional process gases may be injected into the process chamber 200, along with the process gas 212 (for example, refer to FIG. 2C), and the details are omitted herein for simplicity.

Referring to FIG. 14, the second grating material layer 108B with the varying refractive index may be formed on the substrate 100. Through the process chamber 200 illustrated in either of FIGS. 13A and 13B, the varying refractive index of the second grating material layer 108B may be achieved. Dimensions of the second grating material layer 108B may be similar to those of the first grating material layer 108A, and the details are not described again herein to avoid repetition. The portion of the second grating material layer 108B close to the second sidewall 102B may have a refractive index close to or equal to that of the plurality of pre-process grating structures 102 (or the substrate 100). According to some embodiments of the present disclosure, the refractive index of the second grating material layer 108B gradually increases in a horizontal direction away from the second sidewall 102B. The refractive index of the second grating material layer 108B may vary approximately between 1.4 and 4.0.

In the present embodiment, the first grating material layer 108A and the second grating material layer 108B do not need to undergo any patterning processes. Upon forming the second grating material layer 108B, the fabrication of the grating device 30 is completed. According to some embodiments of the present disclosure, each of the plurality of pre-process grating structures 102, the first grating material layer 108A on the corresponding first sidewall 102A, and the second grating material layer 108B on the corresponding second sidewall 102B constitute each of a plurality of grating structures, as shown in FIG. 14. Each of the plurality of grating structures in FIG. 14 includes a unique varying refractive index, in which the refractive index gradually increases from the internal center toward the external edge in an omnidirectional manner.

When the grating structures are designed with the varying refractive index characteristics, the diffraction efficiency of the grating device may be improved. Moreover, the grating device having the varying refractive index characteristics can maintain a superior level of diffraction efficiency across a relatively broader range of wavelength. In other words, during operation, the waveband for light rays to be efficiently diffracted in the grating device may be enlarged.

The foregoing outlines features of several embodiments so that those skilled in the art will better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the prior art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A method forming a grating device, comprising:
    providing a substrate;
    forming a plurality of pre-process grating structures on the substrate;
    entering the substrate into a process chamber; and
    depositing a grating material on one of sidewalls of each of the plurality of pre-process grating structures to form a grating material layer along a top surface of the substrate, wherein a refractive index of the grating material changes during depositing the grating material in the process chamber, and the grating material layer comprises a varying refractive index, in a horizontal direction parallel to the top surface of the substrate, wherein a top surface of the plurality of pre-process grating structures is free of the grating material during deposition, wherein a refractive index of a portion of the grating material layer adjacent to the plurality of pre-process grating structures equals a refractive index of the substrate.

2. The method of claim 1, wherein the grating material layer is patterned into a plurality of grating structures.

3. The method of claim 2, wherein the plurality of grating structures are arranged in an array comprising the varying refractive index in the horizontal direction parallel to the top surface of the substrate.

4. The method of claim 1, wherein depositing the grating material further comprising a first stage, a second stage, and a third stage.

5. The method of claim 4, wherein the process chamber comprising:
    a carrier holding the substrate;
    a first target depositing a first material;
    a second target depositing a second material, wherein a refractive index of the first material and a refractive index of the second material are different; and
    an air valve injecting a process gas into the process chamber.

6. The method of claim 5, wherein:
    during the first stage, the first material is deposited from the first target with a flow rate at a set value, and the second material is deposited from the second target at a flow rate of 0;
    during the second stage, the flow rate of the first material decreases, while the flow rate of the second material increases; and during the third stage, the flow rate of the first material reaches 0, while the flow rate of the second material reaches the set value.

7. The method of claim 5, wherein the first target and the second target are connected to a first voltage controller and a second voltage controller, respectively.

8. The method of claim 7, wherein:
during the first stage, the first voltage controller supplies a voltage at a set value, and the second voltage controller supplies a voltage at 0;
during the second stage, the voltage supplied by the first voltage controller decreases, while the voltage supplied by the second voltage controller increases; and
during the third stage, the voltage supplied by the first voltage controller reaches 0, while the voltage supplied by the second voltage controller reaches the set value.

9. The method of claim 5, wherein a flow rate of the process gas remains the same throughout the first stage, the second stage, and the third stage.

10. The method of claim 4, wherein the process chamber comprising:
a carrier holding the substrate;
a target depositing a material, wherein a flow rate of the material remains the same throughout the first stage, the second stage, and the third stage; and
an air valve injecting a process gas into the process chamber.

11. The method of claim 10, wherein:
during the first stage, the process gas is injected into the process chamber at a flow rate of 0;
during the second stage, the flow rate of the process gas increases; and
during the third stage, the flow rate of the process gas reaches a set value.

12. The method of claim 4, wherein the process chamber comprising:
a carrier holding the substrate;
a target depositing a material, wherein a flow rate of the material remains the same throughout the first stage, the second stage, and the third stage; and
an air valve injecting a first process gas and a second process gas into the process chamber.

13. The method of claim 12, wherein:
during the first stage, the first process gas is injected into the process chamber with a flow rate at a set value, and the second process gas is injected into the process chamber at a flow rate of 0;
during the second stage, the flow rate of the first process gas decreases, while the flow rate of the second process gas increases; and
during the third stage, the flow rate of the first process gas reaches 0, while the flow rate of the second process gas reaches the set value.

14. The method of claim 1, wherein each of the plurality of pre-process grating structures comprises a first sidewall and a second sidewall opposite the first sidewall.

15. The method of claim 14, wherein the substrate is placed on a carrier inside the process chamber, wherein the carrier is tilted to one side for the first sidewall or the second sidewall to face an overlying target.

16. The method of claim 14, wherein the grating material is deposited on the first sidewall or the second sidewall to form the grating material layer along the top surface of the substrate.

17. The method of claim 14, wherein depositing the grating material further comprising:
performing a first process cycle to form a first grating material layer on the first sidewall extending along the top surface of the substrate, wherein a carrier holding the substrate is tilted to one side for the first sidewall to face an overlying target in the process chamber; and
performing a second process cycle to form a second grating material layer on the second sidewall extending along the top surface of the substrate, wherein the carrier holding the substrate is tilted to another side for the second sidewall to face the overlying target in the process chamber.

18. The method of claim 17, wherein the first grating material layer comprises a varying refractive index in a horizontal direction away from the first sidewall, and the second grating material layer comprises a varying refractive index in a horizontal direction away from the second sidewall.

19. The method of claim 17, wherein each of the plurality of pre-process grating structures, the first grating material layer on the corresponding first sidewall, and the second grating material layer on the corresponding second sidewall constitute each of a plurality of grating structures.

\* \* \* \* \*